United States Patent [19]
Lee et al.

[11] Patent Number: 5,877,092
[45] Date of Patent: Mar. 2, 1999

[54] METHOD FOR EDGE PROFILE AND DESIGN RULES CONTROL

[75] Inventors: Shing-Long Lee, Hsin-chu; Julie Huang, Chinchu, both of Taiwan

[73] Assignee: Taiwan Semiconductor Manufacturing Company, Ltd., Hsin-Chu, Taiwan

[21] Appl. No.: 877,985

[22] Filed: Jun. 18, 1997

[51] Int. Cl.⁶ .................................................. H01L 21/00
[52] U.S. Cl. ..................... 438/738; 438/734; 438/743; 438/756; 438/666
[58] Field of Search .................................. 438/710, 704, 438/723, 734, 737, 738, 743, 756, 666, 668; 216/39, 41, 56, 67, 80, 99

[56] References Cited

U.S. PATENT DOCUMENTS

| | | | |
|---|---|---|---|
| 4,372,034 | 2/1983 | Bohr | 438/704 X |
| 4,888,087 | 12/1989 | Moslehu et al. | 156/643 |
| 4,902,377 | 2/1990 | Berglund et al. | 156/643 |
| 5,180,689 | 1/1993 | Liu et al. | 437/228 |
| 5,470,790 | 11/1995 | Myers et al. | 437/192 |
| 5,629,237 | 5/1997 | Wang et al. | 438/704 X |
| 5,672,241 | 9/1997 | Tien et al. | 438/704 X |

*Primary Examiner*—William Powell
*Attorney, Agent, or Firm*—George O. Saile; Stephen B. Ackerman

[57] ABSTRACT

A method is described which uses the differential etch behaviour of two different kinds of sequentially deposited silicon oxide layers in conjunction with controlled thicknesses and etching conditions to allow the etching of features such as via contact holes, oxide sidewalls, and crossover insulation edges to produce non-abrupt step height profiles for better edge coverage while still maintaining close adherence to minimum spacing design ground rules between adjacent features.

10 Claims, 2 Drawing Sheets

5,877,092

METHOD FOR EDGE PROFILE AND DESIGN RULES CONTROL

BACKGROUND OF THE INVENTION

(1) Field of the Invention

The invention relates to the field of design and manufacture of semiconductor integrated circuit devices and more particularly to a novel method for improving the profile of the edge of a step or abrupt feature of the circuit, with respect to coverage by an overlying coating or layer, while also enabling the reduction of the minimum separation design ground rules for circuit feature placement and spacing.

(2) Description of the Prior Art

In the design and manufacture of semiconductor integrated circuit devices, it is necessary to fabricate structural features in the various layers of material involved which have abrupt edges and step-like characteristics. The profiles and aspect ratios of such steps are of significance with respect to coverage by overlying coatings, particularly when the relative dimensions of the step height and overlying coating thickness are closely similar or comparable, as is usually the case. The consequences of this situation are illustrated by reference to FIG. 1, which is a schematic diagram of the cross-section of a portion of a typical semiconductor integrated circuit. In FIG. 1, a semiconductor substrate 10 is coated with an insulating layer of material such as silicon oxide 12. A layer of conductive material 14 is overlaid with another insulating layer 16 through which via contact holes 18 are etched to allow electrical contact with subsequent upper layers 20 as desired. Two significant factors characterize the general suitability of such a typical device cross-section: the detailed nature of the profile of the edge of the via contact hole 21, and the separation between adjacent device features 22, which in this case are the via contact holes. It is readily apparent that the thickness of the layer 20 which crosses over the step 21 will determine the relative ease with which the step 21 can be covered so as to insure the integrity of the portion of layer 20 which is at the sharpest region of the edge. To the extent that the profile of the edge can be controlled so as to vary the acuity of the edge and its relative slope with respect to the vertical, the ease of coverage and the closeness of spacing of adjacent via contact holes will also thus be determined. The same general reasoning applies to other types of edge features common to integrated circuit design and fabrication, such as oxide sidewall profiles adjacent to gate oxide regions, the edges of insulating layers between conductive lines which cross one another, the edges of resistive films, and other similar situations.

The control of edge profiles has been accomplished by taking advantage of such properties of materials such as their etch rates and uniformity of etching under various conditions. Thus, it is possible to etch via contact holes in insulating layers so that the resulting edges are not vertical but have a positive slope or angle less than 90°. This is discussed by Berglund et al in U.S. Pat. No. 4,902,377, in which an isotropic etching process of the oxide insulating layer etches sideways or laterally as well as vertically so that the upper portions of the insulating layer, which are in contact with etching solution longest, have the greatest lateral etching degree, and the result is a tapered edge profile. This will result, of course, in a top dimension considerably larger than the bottom dimension of the contact hole, which must be taken into account in allowing minimum spacing design ground rules for laying out the locations of contact holes in the circuit design. That is, the minimum design spacing must incorporate the fact that the actual etched via holes are larger at the top than the dimensions of the design incorporated in the photomask pattern. Another widely-used method of insuring sloped or tapered edge profiles is to employ either multiple materials with differential rates of etching in a given etchant, as in U.S. Pat. No. 4,888,087 by Moslehi, or different etch methods or etchants in sequence, as discussed by Liu et al in U.S. Pat. No. 5,180,689. None of these references nor the literature in general discuss the use of modifications of the same basic material deposited sequentially in conjunction with differential etching processes to provide an non-vertical step or edge profile while requiring only a minimal increase in the design ground rules for separation between adjacent features to accommodate a larger uppermost dimension of the feature. The employment of a sequential etching process with first an isotropic etch to cause a degree of lateral etching followed by an anisotropic etch to complete the opening of the feature is not mentioned in any reference.

SUMMARY OF THE INVENTION

It is a principal object of the invention to provide a method for controlling the edge profile of step features produced in the fabrication of semiconductor integrated circuit devices to permit sufficient coverage over the edge of the step to insure integrity of the overlying coating. It is a further object of the invention to allow a reduced minimum spacing in the design ground rules for adjacent edge-like features by reducing the size of the increased ratio of upper to lower dimensions required of etched features such as via contact holes while still reducing the abruptness of the edge profile to permit better step coverage. In accordance with the objects of the invention, a method is described which uses the differential etch behaviour of two kinds of sequentially deposited silicon oxide layers in conjunction with controlled etching conditions to allow the etching of features such as via contact holes, oxide sidewalls, and crossover insulation edges to produce non-abrupt edge profiles while still maintaining minimum spacing design ground rules between adjacent features

BRIEF DESCRIPTION OF THE DRAWINGS

In the accompanying drawings forming a material part of this description, there is shown.

DESCRIPTION OF THE PREFERRED EMBODIMENT

Figure 1:
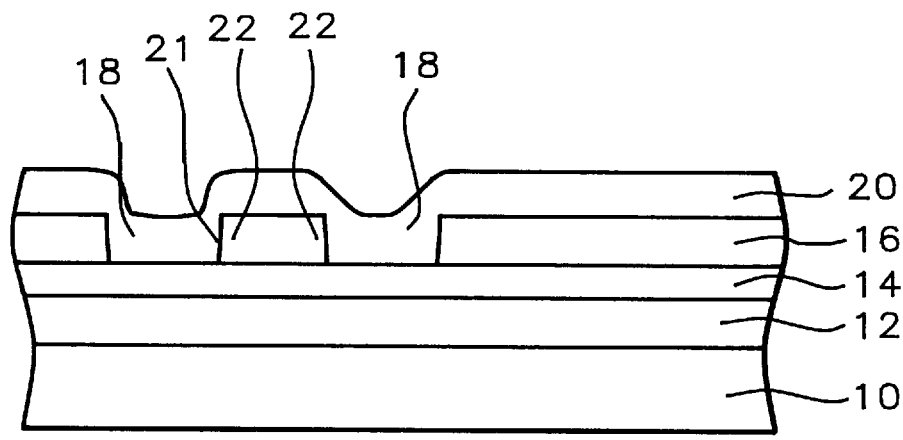
FIG. 1 is a schematic cross-section of a portion of a conventional semiconductor integrated circuit device.
Figure 2:
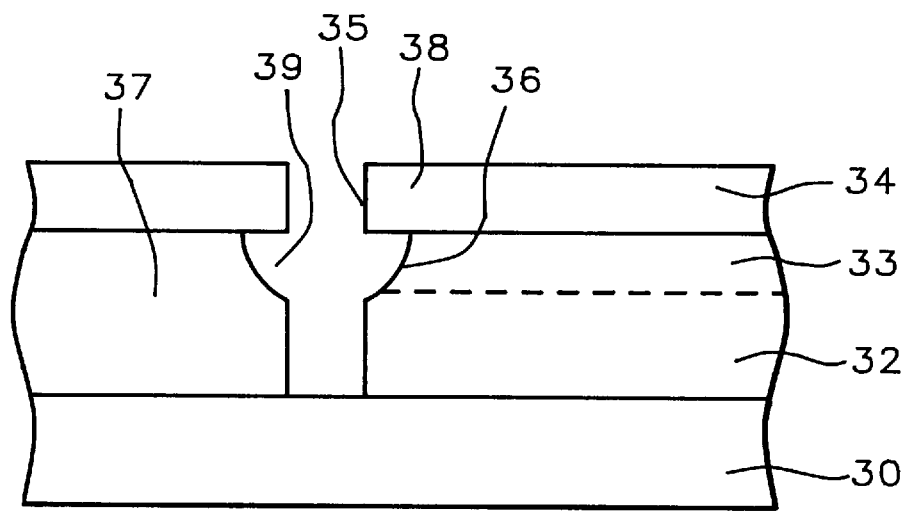
FIG. 2 is a schematic cross-section of a contact via hole of a semiconductor device etched by the prior art.

Referring now more particularly to FIG. 2, there is shown a schematic diagram of a cross-section of a via contact hole of a semiconductor integrated circuit device of the prior art. A conductive layer 30 is coated with a silicon oxide layer 32, 33 deposited by plasma-enhanced chemical vapor deposition (PEOx). Although homogeneous in composition, the PEOx layer is arbitrarily shown divided into two thickness regions labeled as 32 and 33. A photoresist pattern layer 34 overlays the PEOx coating with a pattern opening 35 where a contact via hole is to be placed. The via hole is opened by first etching the PEOx layer with a wet etchant which etches isotropically; i. e., the degree of lateral etching under the resist layer is about the same extent as the degree of vertical etching into the PEOx layer. This is done in the upper portion of the PEOx layer designated as 33. The result is the profile 36 which is approximately spherically curved. The etching process is then stopped and then a second etching process is employed which is anisotropic and completes the formation of the via hole to the conductor layer with a vertical profile 37 due to anisotropic etching of the region of PEOx designated as 32. This type of etching process is typically done in an active gas or gases wherein the etching follows a line-of-sight direction to replicate the pattern opening 35 more or less exactly. Thus, a single material layer of PEOx is differentially etched to produce a via contact hole whose upper diameter is slightly larger than the pattern by the amount of the lateral etch distance 38, and whose profile lacks the verticality and sharp corners which would have been produced by an anisotropic etch process alone. The degree to which lateral etching can be tolerated is determined by the degree to which it is desired to design the closest spacings of adjacent contact holes, and there is a trade-off between close design spacing ground rules, which are contained in the photopattern of the resist, and the degree of sharpness and verticality of the edge of the contact hole.

Figure 3:
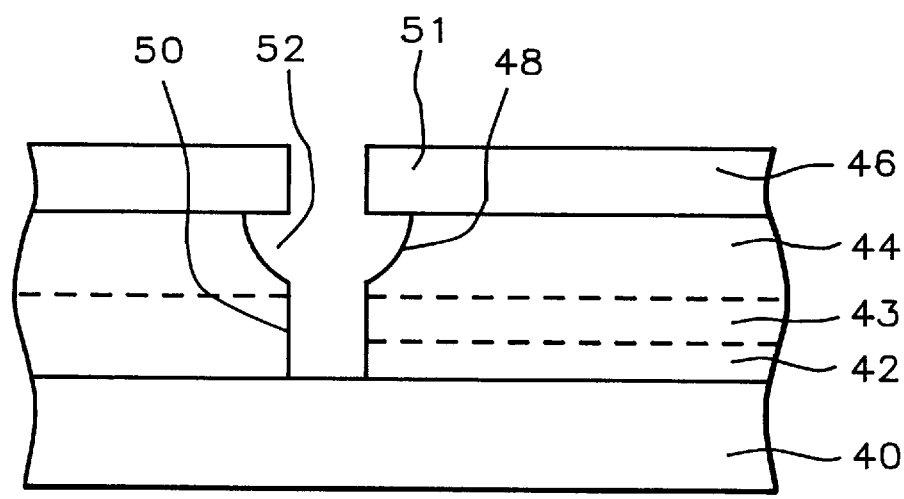
FIG. 3 is a schematic cross-section of a contact via hole of a semiconductor integrated circuit device etched by the current invention.

Referring now more particularly to FIG. 3, there is shown a schematic cross-sectional diagram of a via contact hole of a semiconductor integrated circuit device fabricated according to the current invention. A conductive layer 40 is coated with an insulating layer consisting of two types of silicon oxide insulation. The first, designated as 42 for the lowest region, consists of a high-quality silicon oxide layer as judged by a low etch rate. An example would be a silicon oxide layer deposited by plasma-enhanced chemical vapor deposition (PECVD) from TEOS and further densified by high temperature annealing. This material would be identified as PETEOS(dens). The second or upper region is divided into two distinct and separate regions. The first is a layer of silicon oxide with a relatively fast etch rate such as that deposited by sub-atmospheric pressure chemical vapor deposition(SACVD) designated as 43 and referred to as Oxide 2. The second region, designated as 44, is the uppermost part of the oxide layer and consists of a layer of silicon oxide deposited so as to have a lower etch, such as PEOx. This layer will be referred to as Oxide 1. A photoresist pattern 46 defines the design dimensions of the via contact holes and spacings according to the design ground rules. The etching of the contact hole initially by an isotropic etching process has produced a smaller degree of lateral etching 51 because the PEOx layer 44 etches more slowly than the SACVD layer 43 to give the same depth of etching before terminating the wet etch Proceeding with an anisotropic dry etching process through regions 42 and 43 completes the opening of the contact hole to the conductive layer 40. The net result is that the lateral etched distance 51 is less than the vertical distance 52, thus making the upper dimension of the via contact hole more in conformity to the design ground rules dimension, while still providing a vertical edge profile free from sharp corners or a completely vertical hole wall profile.

For a given etchant, if the etch rate of the upper silicon oxide layer 44 is $e_1$ and the etch rate of the lower silicon oxide layer 42 and 43 is $e_2$, then for an etching time t which is than the time $t_1$ given by:

$$t_1 = \frac{\text{thickness of oxide 44}}{\text{etch rate of oxide 44}}$$

the etching is isotropic and the ratio of dimensions is unity. For longer etching times, where the etching process is continued for an additional time t, proceeding into oxide thickness 43 and 42, the ratio of the dimensions of the etched profile in the oxide is given by:

$$\frac{\text{lateral dimension 51}}{\text{vertical depth 52}} = \frac{\text{etch rate } e_1 \times \text{time } t}{\text{thickness 44} + (\text{etch rate } e_2 \times \Delta t)}$$

$$= \frac{\text{thickness 44} + (\text{etch rate } e_1 \times \Delta t)}{\text{thickness 44} + (\text{etch rate } e_2 \times \Delta t)}$$

The basic point of the invention is thus to etch through oxide layer 1 and into oxide layer 2 in order to control the profile as shown in FIG. 3.

The use of the current invention to form a contact via hole is shown in further detail in Example 1 below, wherein experimentally determined values of the etch rate of two different types of silicon oxide layers deposited to two known thicknesses are used to calculate a ratio (Oxide 1 Etch rate)/(Oxide 2 Etch rate) which provides a figure of merit to determine if the profile and lateral etch rate are acceptable for the particular circuit design:

EXAMPLE 1
Oxide 1/Oxide 2 Thickness Ratio 2:1

Oxide 1 Thk 1000 A Oxide 1 Etch rate 3400 A/min (Buffered Oxide Etch 10:1)

Oxide 2 Thk 500 A Oxide 2 Etch rate 5560 A/min (Buffered Oxide Etch 10:1)

Etch rate 1/Etch rate 2=0.63

Lateral etch depth 51=1000 A+500 A

Vertical etch width 52=1000 A+(500 A×0.63)

Lateral etch depth 51/Vertical etch depth 52

This is a ratio greater than unity, so that the degree of vertical etching will be greater than the degree of lateral etching, reducing the oversizing of the opening of the contact hole with respect to the original design ground rules incorporated into the dimensions of the resist pattern. A higher ratio can be obtained by using a lower thickness of Oxide 2 or a higher etch rate of Oxide 2, which emphasizes the non-verticality of the step profile and hence improves the edge coverage aspect. The choice of Oxide 1 and Oxide 2 thicknesses and the materials' etch rates determine the relative emphasis to be placed on improving edge coverage, shrinking the minimum design ground rules, or a combination of both. The data to enable these choices to be made are given in Tables I-3, wherein etch rates and etch rate/thickness ratios experimentally determined for a variety of deposited silicon oxide materials are given.

TABLE 1

Isotropic Etch Rates for Various Deposited Silicon Oxide Layers
in Buffered Oxide Etch Solution

1. DIFFERENT OXIDE WET ETCH RATE (A/MIN)

|  | LPTEOS | SACVD | PEOX | LPTEOS(den) | PETEOS | PETEOS(den) | BPTEOS(den) |
|---|---|---|---|---|---|---|---|
| BOE10:1 |  | 5562 | 3398 |  | 1800 |  | 580 |
| BOE50:1 | 728 | 717 | 504 | 445 | 314 | 285 | 200 |
| BOE200:1 | 149 | 189 | 163 | 145 | 77 | 66 | 76 |

Table I-3 Legend

PEOx=low temperature chemical vapor deposition from silane
SACVD=sub-atmospheric pressure chemical vapor deposition from $O_2$/TEOS
LPTEOS=low pressure chemical vapor deposition from TEOS
PETEOS=plasma-enhanced chemical vapor deposition from TEOS
PETEOS (dens)=plasma-enhanced chemical vaor deposition from TEOS followed by high- temperature densification
Boron-Phosphorus BPTEOS(dens)=atmospheric pressure or sub-atmospheric pressure chemical vapor deposition from boron-phosphorus doped $O_2$ followed by high-temperature densification
BOE=Buffered Oxide Etch: 10:1 is 91 parts ammonium fluoride solution (40%) and 9 parts hydrofluoric acid (49%)

TABLE 2

A. The isotropic etch ratio of etch time ratio oxide 1/oxide 2 = 2/1

| BOE | PEOX/ SACVD | PEOX/ LPTEOS | LPTEOS(den)/ BPTEOS(den) | PETEOS/ PEOX | PETEOS/ SACVD | PETEOS/ LPTEOS |
|---|---|---|---|---|---|---|
| 10:1 | 1.21 |  |  | 1.30 | 1.70 |  |
| 50:1 | 1.14 | 1.15 | 1.41 | 1.20 | 1.43 | 1.44 |
| 200:1 | 1.12 | 0.94 | 1.30 | 1.37 | 1.48 | 1.31 |

BOE=Buffered Oxide Etchant
etch time ratio=etching time oxide 1 (44) etching time oxide 2 (42,43)=2/1

TABLE 2

B. The isotropic etch ratio of etch time ratio oxide 1/oxide 2 = 1/2

| BOE | PEOX/ SACVD | PEOX/ LPTEOS | LPTEOS(den)/ BPTEOS(den) | PETEOS/ PEOX | PETEOS/ SACVD | PETEOS/ LPTEOS |
|---|---|---|---|---|---|---|
| 10:1 | 1.42 |  |  | 1.59 | 2.39 |  |
| 50:1 | 1.28 | 1.30 | 1.82 | 1.40 | 1.86 | 1.88 |

BOE = Buffered Oxide Etchant

While the invention has been particularly shown and described with reference to the preferred embodiment thereof, it will be understood by those skilled in the art that various changes in form and details may be made without departing from the spirit and scope of the invention.

What is claimed is:

1. A method in the design and manufacture of semiconductor integrated circuit devices which allows close adherence to design ground rule dimensions as manifest in photoresist patterns while avoiding or ameliorating edge coverage difficulties over sharp corners and vertical profiles of steps comprising:
   establishing a conductive layer;
   coating said conductive layer with a layer of high-quality silicon oxide;
   depositing at least two layers of silicon oxide of selected thicknesses and isotropic etch rates over said layer of high-quality silicon oxide;
   depositing, exposing and developing a photoresist layer pattern over said two layers of silicon oxide;
   etching the topmost of said two layers of silicon oxide layer in an isotropic etch solution;
   etching of a subsequent silicon oxide layer of said two layers of silicon oxide in an isotropic etch solution; and
   final etching of said high-quality silicon oxide layer to conductor layer by an anisotropic etching process.

2. The method of claim 1 wherein said silicon oxide layers are selected from the group of silicon oxides consisting of:
   low pressure chemical vapor deposition from tetraethoxysilane;
   sub-atmospheric pressure chemical vapor deposition from O3/TEOS;
   plasma-enhanced chemical vapor deposition from silane;
   plasma-enhanced chemical vapor deposition from tetraethoxysilane;
   plasma-enhanced chemical vapor deposition from tetraethoxysilane followed by high-temperature densification at about 850 C.; and boron-phosphorus doped chemical vapor deposition from tetraethoxysilane followed by densification at 850 C.

3. The method of claim 1 wherein said isotropic etch solution consists of ammonium fluoride, hydrofluoric acid, and water.

4. The method of claim 1 wherein said final anisotropic etching process is a dry, gas-phase subtractive method which replicates the photoresist pattern in a line-of-sight fashion.

5. A process in the manufacture of semiconductor integrated circuit devices for forming via contact holes in silicon oxide layers used for insulation and passivation comprising:

establishing a conductive layer on a substrate;

coating said conductive layer with deposited layers of silicon oxide of known thicknesses and etch rates;

depositing, exposing, and developing a photoresist layer with an appropriate via contact hole pattern over the silicon oxide layers;

partial etching of via contact hole into the upper portions of the silicon oxide layers with an isotropic etching solution;

final etching of via contact hole to the conductive layer by means of an anisotropic etching process.

6. The process of claim 5 wherein said deposited layers of silicon oxide comprise:

a bottom layer of deposited silicon oxide in contact with the conductive layer;

an intermediate layer of silicon oxide having the same etch rate as the bottom layer in isotropic etching solution an upper layer of silicon oxide having a lower etch rate than the lower silicon oxide layer or layers in isotropic etching solution.

7. The process of claim 5 wherein said silicon oxide layer thickness ranges from between about 1000 A to 3000 A.

8. The process of claim 5 wherein said silicon oxide deposited layers are chosen from the group whose etch rates are established by experiment after deposition by processes comprising:

low pressure chemical vapor deposition from tetraethoxysilane;

sub-atmospheric pressure chemical vapor deposition from oxygen-tetraethoxysilane;

plasma-enhanced chemical vapor deposition from silane;

low pressure chemical vapor deposition from tetraethoxysilane;

plasma-enhanced chemical vapor deposition from tetraethoxysilane;

plasma-enhanced chemical vapor deposition from tetraethoxysilane followed by high-temperature densification at about 850 C.;

boron-phosphorus doped chemical vapor deposition from tetraethoxysilane followed by high-temperature densification at about 850 C.

9. The process of claim 5 wherein said isotropic etch solution is chosen from ammonium fluoride, hydrofluoric acid, and water mixed at various concentrations and dilutions.

10. The process of claim 5 wherein said final anisotropic etch process is a dry, gas-phase selective process which replicates the photoresist pattern in a line-of-sight fashion.

* * * * *